United States Patent
Kuo et al.

(10) Patent No.: US 9,196,508 B2
(45) Date of Patent: Nov. 24, 2015

(54) METHOD FOR PRODUCING THREE-DIMENSIONAL INTEGRATED CIRCUIT STRUCTURE

(71) Applicants: Yang-Kuo Kuo, Taoyuan County (TW); Chia-Yi Hsiang, Taoyuan County (TW); Hung-Tai Ku, Taoyuan County (TW)

(72) Inventors: Yang-Kuo Kuo, Taoyuan County (TW); Chia-Yi Hsiang, Taoyuan County (TW); Hung-Tai Ku, Taoyuan County (TW)

(73) Assignee: NATIONAL CHUNG SHAN INSTITUTE OF SCIENCE AND TECHNOLOGY, Taoyuan (TW)

( * ) Notice: Subject to any disclaimer, the term of this patent is extended or adjusted under 35 U.S.C. 154(b) by 27 days.

(21) Appl. No.: 13/655,487

(22) Filed: Oct. 19, 2012

(65) Prior Publication Data

US 2014/0054790 A1   Feb. 27, 2014

(30) Foreign Application Priority Data

Aug. 22, 2012   (TW) .............................. 101130435 A

(51) Int. Cl.
| | |
|---|---|
| H01L 23/48 | (2006.01) |
| H01L 21/60 | (2006.01) |
| H01L 21/56 | (2006.01) |
| H01L 23/31 | (2006.01) |
| H01L 23/00 | (2006.01) |
| H01L 23/15 | (2006.01) |
| H01L 23/538 | (2006.01) |
| H01L 25/065 | (2006.01) |
| H01L 23/498 | (2006.01) |

(52) U.S. Cl.
CPC ................ *H01L 21/56* (2013.01); *H01L 23/15* (2013.01); *H01L 23/3121* (2013.01); *H01L 23/5384* (2013.01); *H01L 23/564* (2013.01); *H01L 23/49816* (2013.01); *H01L 25/0655* (2013.01); *H01L 2224/16225* (2013.01); *H01L 2924/0002* (2013.01); *H01L 2924/15311* (2013.01)

(58) Field of Classification Search
CPC ......... H01L 21/60; H01L 21/50; H01L 23/02; H01L 21/768; H01L 23/48; H01L 23/498; H01L 23/52; H01G 4/228; H05K 3/36; G01R 31/36
USPC ............ 257/48, 774, E23.011, 765, 686, 854, 257/777; 324/62.06; 361/306.3
See application file for complete search history.

(56) References Cited

U.S. PATENT DOCUMENTS

| | | | |
|---|---|---|---|
| 2003/0020171 A1* | 1/2003 | Dutta et al. .................... | 257/773 |
| 2003/0110629 A1* | 6/2003 | Horng et al. .................... | 29/854 |
| 2004/0173891 A1* | 9/2004 | Imai et al. ...................... | 257/686 |
| 2004/0184219 A1* | 9/2004 | Otsuka et al. .............. | 361/306.3 |
| 2011/0175639 A1* | 7/2011 | Yoko et al. ............... | 324/762.06 |

* cited by examiner

*Primary Examiner* — Fernando L Toledo
*Assistant Examiner* — Lawrence-Linh T Nguyen
(74) *Attorney, Agent, or Firm* — Chun-Ming Shih

(57) ABSTRACT

A three-dimensional integrateds circuit structure includes a first metal circuit substrate, an interposer substrate disposed on the first metal circuit substrate and electrically connected therewith, and at least one semiconductor component disposed on the interposer substrate. The interposer substrate is used to dissipate the heat generated by the operation of the semiconductor components, so as to achieve the objective of increasing the lifespan of the semiconductor components.

7 Claims, 3 Drawing Sheets

METHOD FOR PRODUCING THREE-DIMENSIONAL INTEGRATED CIRCUIT STRUCTURE

BACKGROUND OF THE INVENTION

1. Field of the Invention

The present invention is generally related to a (3DIC) three-dimensional integrated circuit structure and a method of interposer substrate, and particularly to a three-dimensional integrated circuit structure by using an aluminum nitride as an interposerlayer.

2. Description of Related Art

The development of lighter, thinner, shorter and smaller electronic products with high system integration and capability to surf the NET wirelessly has become the focus of electronic industry nowadays.

The three-dimensional integrated circuits is a three-dimensional stacked chip integration, which not only can shorten the length of metal conductive wires and the resistance therebetween, it also reduces chip area and have the advantages such as size reducing, integration improvement, low power consumption and production cost reduce. However, after the semiconductor volume is reduced or multi layers are stacked, the temperature of the semiconductor structure is high, both the service lifespan and the effectiveness of the semiconductor component are decreased due to the high temperature.

Conventional silicon substrate needs to produce a silicon dioxide insulation layer thereon. However, this kind of insulating layer easily causes electricity leakage, which also affects the lifespan of the semiconductor components.

In view of the above mentioned problems, how to solve the issues such as temperature rises and electricity leakage of the semiconductor structure, which affects the semiconductor component lifespan, is the lesson the industry needs to resolve.

SUMMARY OF THE INVENTION

The main objective of the present invention is to provide a three-dimensional integrateds circuit structure and a method of making the same. An aluminum nitride is used as an interposer substrate of the three-dimensional integrateds circuit structure to dissipate the heat generated by the operation of the semiconductor components so as to achieve the objective of increasing the lifespan of the semiconductor components.

Another objective of the present invention is to provide a three-dimensional integrateds circuit structure and a method of making the same. The three-dimensional integrateds circuit structure uses an aluminum nitride as an interposer layer to reduce the temperature of the three-dimensional integrateds circuit structure, and to avoid shortening the lifespan of the semiconductor element in a high temperature state. The interposer substrate is made of an insulating material, which can effectively block the power energy and solve the electricity leakage problem.

In order to achieve the above mentioned objectives, the present invention provides a three-dimensional integrateds circuit structure, including a substrate, an interposer substrate and at least one semiconductor component, wherein a first metal circuit layer is formed on the top of the substrate, an intermediate layer is positioned on the first metal circuit layer and has a plurality of through holes filled with conductors. While a plurality of conductive pads are formed on one side of the interposer layer, a second metal circuit layer is formed on the other side, which is electrically connected to the first metal circuit layer via the conductive pads, and electrically connected to the at least one semiconductor component on the interposer substrate, wherein the interposer substrate is made by aluminum nitride, and the interposer substrate is used to dissipate the heat generated by the operation of the semiconductor components and avoid electricity leakage and high temperature so as to increase the lifespan of the semiconductor components.

BRIEF DESCRIPTION OF THE DRAWINGS

The invention, as well as its many advantages, may be further understood by the following detailed description and drawings in which.

DETAILED DESCRIPTION OF THE INVENTION

Aluminum nitride substrate can be produced as a wafer, which can be made into 2-inch, 4-inch, 6-inch, 8-inch, 12-inch and 18-inch standard sizes, or other non-standard sizes with different specifications.

Besides that the wafer can be made as a circular shape, the wafer can also be made as square and rectangular shapes. Furthermore, the wafer can be made as the interposer substrate of the present invention by utilizing the semiconductor equipment and the process thereof.

Figure 1:
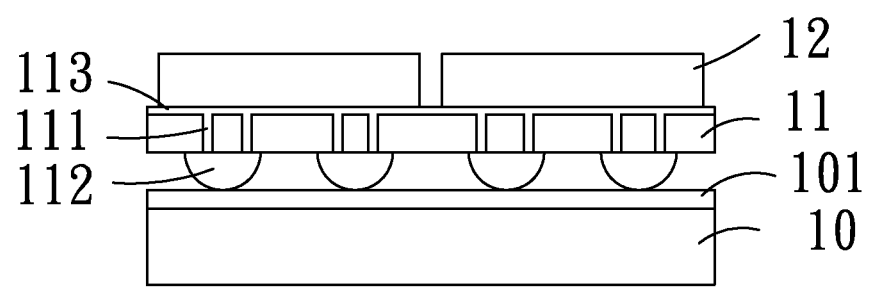
FIG. 1 is a schematic diagram showing an embodiment of a three-dimensional integrateds circuit structure of the present invention.

With reference to FIG. 1, which is a schematic diagram showing an embodiment of a three-dimensional integrateds circuit structure of the present invention.

In a preferred embodiment, the three-dimensional integrateds circuit structure of the present invention includes a substrate 10 having a first metal circuit layer 101, an interposer substrate 11 electrically connected to the first metal circuit layer 101, and at least one semiconductor component 12, wherein the interposer substrate 11 is made by aluminum nitride, and the interposer substrate 11 may be made of a material selected from the following group consisting of: silicon nitride, aluminum oxide, silicon carbide and gallium nitride, and has through holes 111 defined in the interposer substrate 11 via laser perforation, semiconductor etching or sandblasting perforation.

While a plurality of conductive pads 112 are formed on one side of the interposer substrate 11, a second metal circuit layer 113 is formed on the other side thereof. The plurality of through holes 111 are filled with conductors, which can electrically connect to the periphery of each semiconductor component 12, so that the interposer substrate 11 is used to dissipate the heat generated by the operation of the semiconductor components 12 and avoid electricity leakage generated by the operation of the semiconductor components 12 in a high temperature state, so as to increase the lifespan of the semiconductor components 12.

Figure 2:
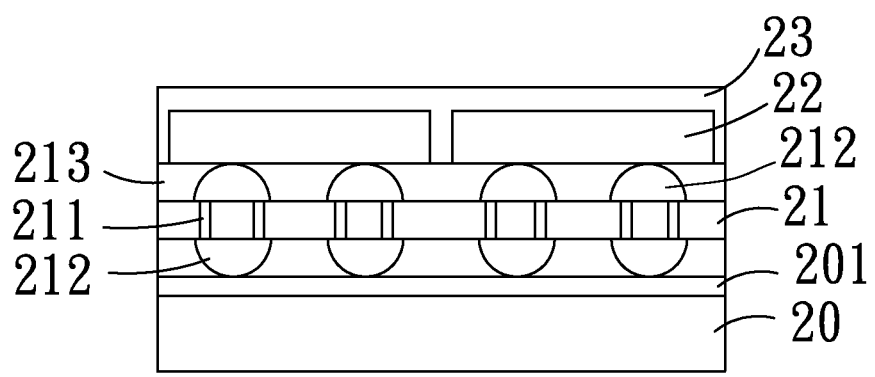
FIG. 2 is a schematic diagram showing another embodiment of a three-dimensional integrateds circuit structure of the present invention.

With reference to FIG. 2, which is a schematic diagram showing another embodiment of a three-dimensional integrateds circuit structure of the present invention.

In another preferred embodiment, the three-dimensional integrateds circuit structure includes a substrate 20 having a first metal circuit layer 201, an interposer substrate 21 disposed on the first metal circuit layer 201, at least one semiconductor component 22 disposed on the interposer substrate 21, and a protective layer 23 formed on both the interposer substrate 21 and each of the at least one semiconductor component 22.

Wherein the interposer substrate 21 has a plurality of through holes 211, a plurality of conductive pads 212 formed on one side of the interposer substrate 21, and a second metal circuit layer 213 formed on the other side of the interposer substrate 21. The plurality of through holes 211 are filled with conductors to electrically connect to the substrate 20 and the second metal circuit layer 213. And the electrical connection areas (can be configured as a plural of conductive pads 212) around the periphery of each of the at least one semiconductor component 22 electrically connects to the second metal circuit layer 213. A protective layer 23 formed on the interposer substrate 21 and the each of the at least one semiconductor element 22 is used to reduce the impact caused by external water vapor and other substances, and the interposer substrate 21 is used to dissipate heat generated by the operation of the semiconductor components 22 and avoid the electricity leakage generated by the operation of the semiconductor components 22 in a high temperature state, so as to further achieve the purpose of increasing the lifespan of the semiconductor components 22.

Figure 3:
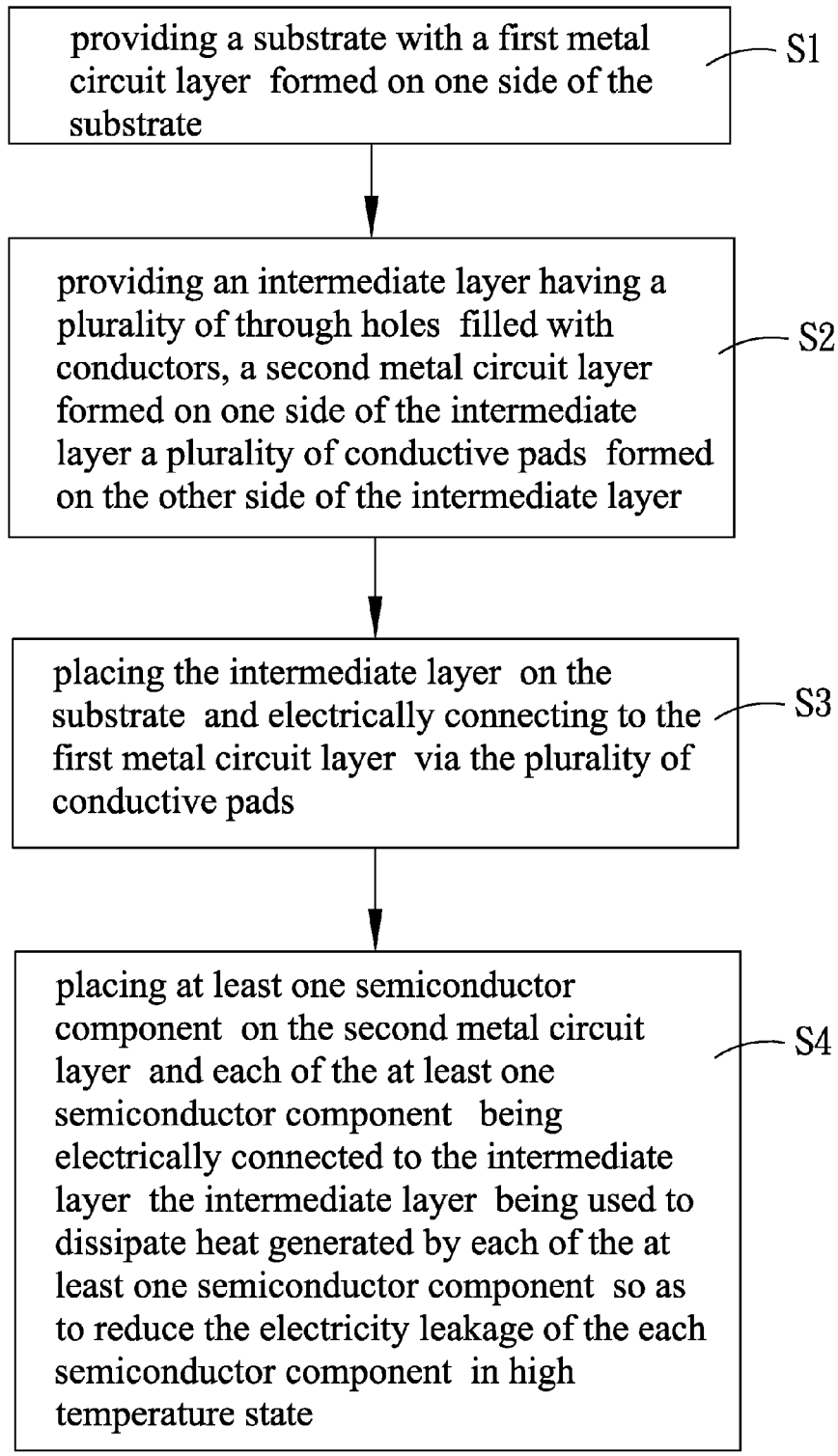
FIG. 3 is a flowchart showing the manufacturing process for the three-dimensional integrateds circuit structure of the present invention.

With reference to FIG. 3, which is a flowchart showing the manufacturing process for the three-dimensional integrateds circuit structure of the present invention, including the following steps:

step 1 S1: providing a substrate 10, 20 with a first metal circuit layer 101, 201 formed on one side of the substrate 10, 20;

step 2 S2: providing an interposer substrate 11, 12 having a plurality of through holes 21 filled with conductors, a second metal circuit layer 101, 201 formed on one side of the interposer substrate 11, 12, a plurality of conductive pads 112, 212 formed on the other side of the intermediate layer 11, 12;

step 3 S3: placing the interposer substrate 11, 21 on the substrate 10, 20, and electrically connecting to the first metal circuit layer 101,201 via the plurality of conductive pads 112, 212;

step 4 S4: placing at least one semiconductor component 12, 22 on the second metal circuit layer 113, 213, and each of the at least one semiconductor component 12, 22 being electrically connected to the interposer substrate 11, 21, the interposer substrate 11, 21 being used to dissipate heat generated by each of the at least one semiconductor component 12, 22, so as to reduce the electricity leakage of the each semiconductor component 12, 22 in high temperature state.

Furthermore, in step 4 S4, each of the at least one semiconductor component 12, 22 electrically connects to the interposer substrate 11, 21, a protective layer 23 is formed on the interposer substrate 11, 21 and the each of the at least one semiconductor component 12, 22. The intermediate layer 11, 21 is used to dissipate the heat generated by each of the at least one semiconductor component 12, 22, and reduce the electricity leakage of the semiconductor component 12, 22 in high temperature state.

Many changes and modifications in the above described embodiment of the invention can, of course, be carried out without departing from the scope thereof. Accordingly, to promote the progress in science and the useful arts, the invention is disclosed and is intended to be limited only by the scope of the appended claims.

What is claimed is:

1. A method for producing three-dimensional integrated circuit structure, comprising the steps of:
   providing a substrate with a single piece first metal circuit layer directly formed on one side of the substrate;
   providing an interposer substrate with a single piece second metal circuit layer directly formed on a side of the interposer substrate opposite to the side of the substrate where the single piece first metal circuit layer is disposed on, the interposer substrate including a plurality of through holes filled with conductors, wherein the single piece first metal circuit layer is provided between the substrate and the interposer substrate;
   forming a plurality of conductive pads on a first surface, facing the single piece first metal circuit layer, of the interposer substrate, wherein the plurality of conductive pads are formed on the same side of the substrate as the single piece first metal circuit layer and directly contact the single piece first metal circuit layer;
   forming a single piece second metal circuit layer on a second surface, opposite to the first surface, of the interposer substrate; and
   placing at least one semiconductor component on the interposer substrate, wherein the at least one semiconductor component is electrically connected to the single piece second metal circuit layer, whereby the interposer substrate is able to be used to dissipate heat generated by operation of the at least one semiconductor component and avoid electricity leakage generated by the at least one semiconductor component in high temperature state,
   wherein the single piece first metal circuit layer electrically connects the plurality of conductive pads on the first surface of the substrate, and the single piece second metal circuit layer electrically connects the conductors filled in the plurality of through holes in the interposer substrate, and
   wherein each of the plurality of conductive pads is electrically connected to each of the conductors filled in the plurality of through holes by the single piece first metal circuit layer.

2. The method for producing three-dimensional integrated circuit structure as claimed in claim 1, wherein the at least one semiconductor component has electrical connection areas.

3. The method for producing three-dimensional integrated circuit structure as claimed in claim 2, wherein the electrical connection areas are conductive pads.

4. A method for producing three-dimensional integrated circuit structure, comprising the steps of:
   providing a substrate with a single piece first metal circuit layer directly formed on one side of the substrate;
   providing an interposer substrate with a single piece second metal circuit layer directly formed on a side of the interposer substrate opposite to the side of the substrate where the single piece first metal circuit layer is disposed on, the interposer substrate including a plurality of through holes filled with conductors, wherein the single piece first metal circuit layer is provided between the substrate and the interposer substrate;
   forming a plurality of conductive pads on a first surface, facing the single piece first metal circuit layer, of the interposer substrate, wherein the plurality of conductive pads are formed on the same side of the substrate as the single piece first metal circuit layer and directly contact the single piece first metal circuit layer;

forming a single piece second metal circuit layer on a second surface, opposite to the first surface, of the interposer substrate;

providing at least one semiconductor component;

placing the at least one semiconductor component on the interposer substrate and electrically connected to the single piece second metal circuit layer; and forming a protective layer on both the interposer substrate and each of the at least one semiconductor component, so that the interposer substrate is used to dissipate heat generated by operation of the at least one semiconductor component and avoid electricity leakage generated by the at least one semiconductor component in high temperature state, wherein the single piece first metal circuit layer electrically connects the plurality of conductive pads on the first surface of the substrate, and the single piece second metal circuit layer electrically connects the conductor filled in the plurality of through holes in the interposer substrate, and wherein each of the plurality of conductive pads is electrically connected to each of the conductors filled in the plurality of through holes by the single piece first metal circuit layer.

5. The method for producing three-dimensional integrated circuit structure as claimed in claim 4, wherein the interposer substrate is made of a material selected from the following group consisting of: aluminum nitride, aluminum oxide, and gallium nitride.

6. The method for producing three-dimensional integrated circuit structure as claimed in claim 4, wherein the at least one semiconductor component has electrical connection areas.

7. The method for producing three-dimensional integrated circuit structure as claimed in claim 6, wherein the electrical connection areas are conductive pads.

* * * * *